United States Patent [19]

Yashiro

[11] Patent Number: 4,627,035

[45] Date of Patent: Dec. 2, 1986

[54] SWITCHING CIRCUIT FOR MEMORY DEVICES

[75] Inventor: Kenji Yashiro, Tokyo, Japan

[73] Assignee: Pioneer Electronic Corp., Tokyo, Japan

[21] Appl. No.: 618,167

[22] Filed: Jun. 7, 1984

[30] Foreign Application Priority Data

Jun. 8, 1983 [JP] Japan .................................. 58-102263

[51] Int. Cl.⁴ ................................................. G11C 8/00
[52] U.S. Cl. ........................................ 365/230; 365/189
[58] Field of Search ................................. 365/230, 189; 364/200 MS File, 900 MS File

[56] References Cited

U.S. PATENT DOCUMENTS 4,475,176 10/1984 Ishii ....................................... 365/230
4,521,858 6/1985 Kraemer et al. ..................... 364/200

*Primary Examiner*—Terrell W. Fears
*Assistant Examiner*—Guy M. Miller
*Attorney, Agent, or Firm*—Sughrue, Mion, Zinn, Macpeak & Seas

[57] ABSTRACT

A memory system including a circuit for switching control of a read-only memory and a random-access memory to allocate addresses thereto. The addresses are switched between the read-only memory and the random-access memory by selecting a mode in which the read-only memory is operated when reading therefrom and the random-access memory is operated when writing thereinto, and a mode in which the random-access memory is operated when reading therefrom and writing thereinto.

2 Claims, 4 Drawing Figures

SWITCHING CIRCUIT FOR MEMORY DEVICES

BACKGROUND OF THE INVENTION

The present invention relates to a memory system including a memory device for switching control of a read-only memory (ROM) and a random-access memory (RAM) to allocate addresses to the two memories.

FIG. 1 of the accompanying drawings illustrates a known memory device of the type described. A data signal 1 is read out of a ROM 2 or read out of or written into a RAM 3. The ROM 2 and the RAM 3 are supplied with an address signal 4. Use of either the ROM 2 or the RAM 3 is selected by a control signal 5 applied through a changeover switch 6 to the ROM 2 or the RAM 3. The switching operation of the changeover switch 6 is effected by a ROM/RAM switching signal 8 stored in a switching control unit 7 and generated in response to input signal 10.

With the prior arrangement shown in FIG. 1, either the ROM 2 only is accessed or the RAM 3 only is accessed for one address at a time by the ROM/RAM switching signal 8. The prior memory device has previously been incorporated in computers.

A procedure to be followed by the illustrated memory device before operation of a control program or an operating system (OS) is started is illustrated in FIG. 2 of the accompanying drawings. When the system's power supply is switched on, a central processing unit (CPU) reads the control program or OS from the ROM 2 in a step a, and starts to operate a peripheral device such as a disk drive to execute program transfer from the peripheral device to the RAM 3 in a step b. At this stage, the ROM/RAM switching signal 8 is issued from the switching control unit 7 to actuate the changeover switch 6 for shifting the control signal 5 from the ROM 2 to the RAM 3, thus effecting switching from the ROM 2 to the RAM 3 for the same address area in a step c. The OS is then transferred again into the address area in the RAM 3 so that the OS is fully stored again at executable addresses in a step d.

Since the ROM 2 and the RAM 3 are controlled at the same addresses for the transfer of the OS to the RAM 3, it has been necessary to write the OS once at addresses different from executable addresses, and to transfer the OS again to the executable addresses in the RAM 3 after switching has been effected from the ROM 2 to the RAM 3. Therefore, the OS is required to be transferred twice before it is written into the RAM 3 by the CPU. The above conventional procedure is disadvantageous especially with personal computers in which an entire 64K-byte area is constituted by a RAM since address modification is complex.

SUMMARY OF THE INVENTION

With the above drawback in view, it is an object of the present invention to provide a memory system capable of storing an OS at normal addresses, shared by both ROM and RAM, through one transfer process when the OS is to be read into the RAM.

To achieve the above object, there is provided a memory device for switching control of a read-only memory and a random-access memory to allocate the same addresses, the memory device being of such a circuit arrangement that the addresses can be switched between the read-only memory and the random-access memory by selecting a mode in which the read-only memory is operated when reading therefrom and the random-access memory is operated when writing thereinto, and a mode in which the random-access memory is operated when reading therefrom and writing thereinto.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
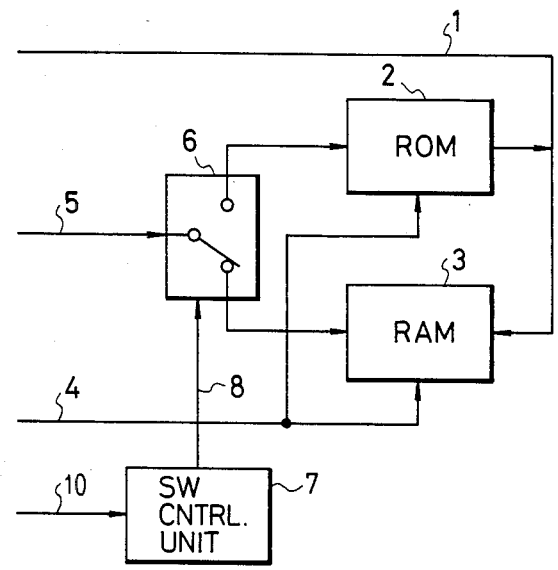
FIG. 1 is a block diagram of a conventional memory device.
Figure 2:
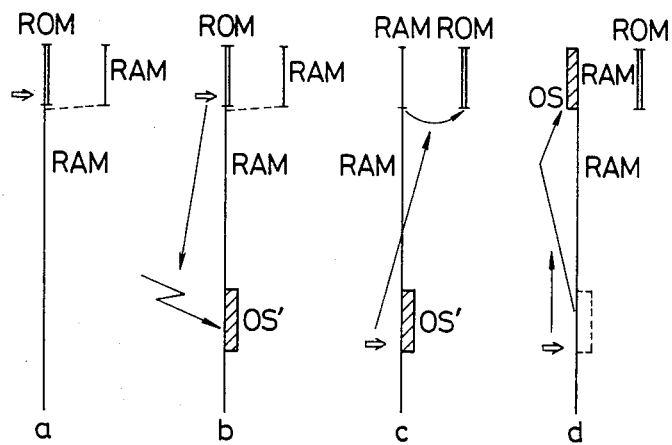
FIG. 2 is a diagram illustrative of a procedure for writing an operating system into the memory device shown in FIG. 1.
Figure 3:
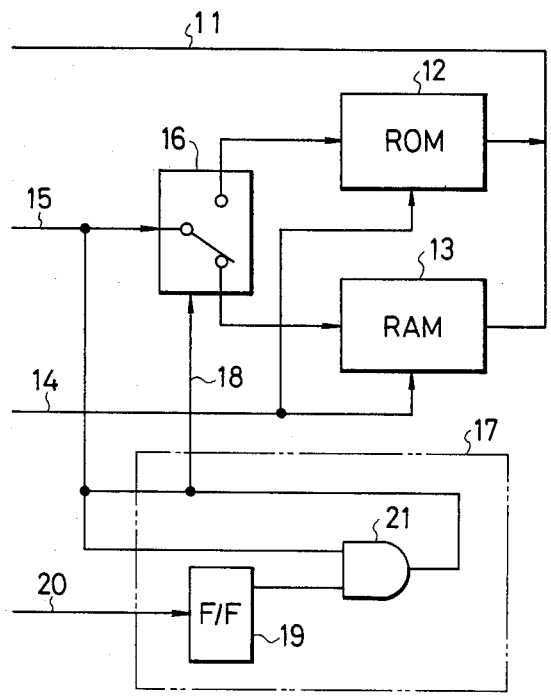
FIG. 3 is a block diagram of a memory device according to the present invention.
Figure 4:
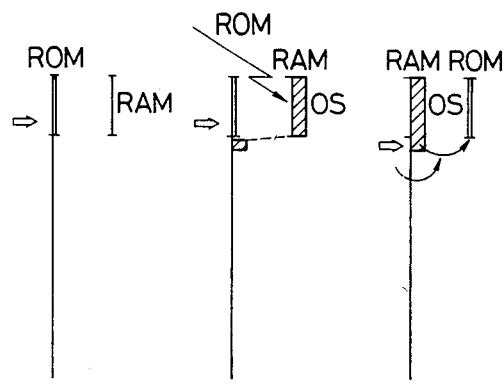
FIG. 4 is a diagram illustrative of a procedure for writing an operating system into the memory device shown in FIG. 3.

A memory device according to the present invention will be described with reference to FIGS. 3 and 4. A data signal 11 is read out of a ROM 12 or read out of or written into a RAM 13. The ROM 12 and the RAM 13 are supplied with an address signal 14. Either the ROM 12 or the RAM 13 is selected at one time by a control signal 15 applied through a changeover switch 16 to the ROM 12 or the RAM 13. The switching operation of the changeover switch 16 is effected by a switching signal 18 from a switching control unit 17.

The switching control unit 17 includes a ROM/RAM switching flip-flop 19 to which a ROM/RAM switching control signal 20 is applied. An output signal from the ROM/RAM switching flip-flop 19 is fed to an AND gate 21. When the memory control signal 15 is a memory read signal, it is issued from the AND gate 21 and switches the changeover switch 16 to apply the control signal 15 to the ROM 12. When the memory control signal 15 is a memory write signal, it is applied directly as the switching control signal 18 to switch the changeover switch 16 to apply the control signal 15 to the RAM 13.

With the above control employed, the flip-flop 19 is adapted to effect switching between a ROM-readout mode and a RAM mode. When the control signal 15 is a write command, the RAM 13 will be connected to or will remain connected to changeover switch 16 for writing irrespectively of the above modes, and hence the write control signal becomes a switching signal unconditionally. FIG. 4 shows a procedure for starting a control program or operating system (OS) with the memory device shown in FIG. 3. When the power supply is switched on, a central processing unit (CPU) reads the control program or OS from the ROM 12 and starts to operate a peripheral device such as a disk drive to execute program transfer from the peripheral device to the RAM 13. Since the control signal 15 is a write signal at this time, the changeover switch 16 has been switched to the RAM mode, and hence the OS is transferred from the ROM 12 directly to an address area in the RAM 13. As a consequence, it is not necessary to transfer the OS into another address area in the RAM 13, switch the modes, and then transfer the OS again into the executable address area in the RAM 13, a procedure which is required by the conventional memory device.

With the arrangement of the present invention, the memory device has a mode for operating the ROM for reading and the RAM for writing and also a mode for operating the RAM for reading and writing. The OS can be transferred in one process since the RAM is switched to its operating mode as long as the switching signal is a write control signal. The memory device of the invention allows the ROM and RAM to be disposed parallel to each other for the same addresses in a personal computer system which does not have a peripheral device such as a disk drive, which is advantageous in that it can transfer an operating system faster than a disk drive.

Although a certain preferred embodiment has been shown and described, it should be understood that many changes and modifications may be made therein without departing from the scope of the appended claims.

I claim:

1. A memory system comprising:
    a read-only memory;
    a random-access memory, said read-only memory and said random-access memory having address ports commonly coupled to an address signal bus, data ports commonly coupled to an input/output bus and individual read/write control ports;
    changeover switch means having an input receiving a memory read/write control signal and first and second outputs coupled to said read/write control ports of said read-only memory and said random-access memory, respectively,
    a flip-flop means receiving a read-only memory/random-access memory switching control signal; and
    an AND gate having a first input coupled to an output of said flip-flop, a second input receiving said read/write control signal, and an output applied with said read/write control signal to a control input of said changeover switch means.

2. The memory system, as claimed in claim 1 wherein the application of a memory read control signal will cause said changeover switch to switch to the random access memory if said switch was connected to said read only memory and to switch to the read only memory if said switch was connected to said random access memory; and
    the application of a memory write control signal will cause said changeover switch means to switch to said random access memory, if said switch was connect to said read only memory, and to remain switched to said random access memory, if said switch was connected to said random access memory, and in both cases to effect a writing into said random access memory.

* * * * *